(12) United States Patent
Freeman

(10) Patent No.: US 10,910,306 B2
(45) Date of Patent: Feb. 2, 2021

(54) DEVICES INCLUDING VIAS EXTENDING THROUGH ALTERNATING DIELECTRIC MATERIALS AND CONDUCTIVE MATERIALS, AND RELATED ELECTRONIC DEVICES

(71) Applicant: Micron Technology, Inc., Boise, ID (US)

(72) Inventor: Eric H. Freeman, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/870,417

(22) Filed: May 8, 2020

(65) Prior Publication Data

US 2020/0273793 A1 Aug. 27, 2020

Related U.S. Application Data

(63) Continuation of application No. 16/524,994, filed on Jul. 29, 2019, which is a continuation of application
(Continued)

(51) Int. Cl.
*H01L 23/522* (2006.01)
*H01L 21/768* (2006.01)
(Continued)

(52) U.S. Cl.
CPC ...... *H01L 23/5223* (2013.01); *H01L 21/7687* (2013.01); *H01L 21/76852* (2013.01);
(Continued)

(58) Field of Classification Search
None
See application file for complete search history.

(56) References Cited

U.S. PATENT DOCUMENTS 5,195,019 A 3/1993 Hertz
8,405,141 B2 * 3/2013 Matsuda ........... H01L 27/11573
257/324

(Continued)

FOREIGN PATENT DOCUMENTS

CN 102263108 A 3/2016
CN 106558591 A 4/2017
(Continued)

OTHER PUBLICATIONS

Chinese First Office Action for Chinese Application No. 201810967296, dated Dec. 27, 2019, 16 pages with translation.
(Continued)

*Primary Examiner* — Lex H Malsawma
(74) *Attorney, Agent, or Firm* — TraskBritt

(57) ABSTRACT

A semiconductor device includes a capacitor structure. The capacitor structure comprises conductive vias extending through openings in a stack of alternating dielectric materials and first conductive materials, each conductive via comprising a second conductive material extending through the openings and another dielectric material on sidewalls of the openings, first conductive lines in electrical communication with a first group of the conductive vias, and second conductive lines in electrical communication with a second group of the conductive vias. Related semiconductor device, electronic systems, and methods are disclosed.

20 Claims, 9 Drawing Sheets

Related U.S. Application Data

No. 15/687,830, filed on Aug. 28, 2017, now Pat. No. 10,373,904.

(51) Int. Cl.

| | | |
|---|---|---|
| *H01L 27/11582* | (2017.01) | |
| *H01L 27/11556* | (2017.01) | |
| *H01L 49/02* | (2006.01) | |
| *H01L 27/11573* | (2017.01) | |

(52) U.S. Cl.
CPC .. *H01L 21/76877* (2013.01); *H01L 27/11556* (2013.01); *H01L 27/11582* (2013.01); *H01L 28/91* (2013.01); *H01L 27/11573* (2013.01)

(56) References Cited

U.S. PATENT DOCUMENTS

| | | | |
|---|---|---|---|
| 8,933,502 | B2 | 1/2015 | Higashitani et al. |
| 9,905,514 | B2 | 2/2018 | Tanzawa |
| 10,043,751 | B2 | 8/2018 | Thimmegowda et al. |
| 10,373,904 | B2 * | 8/2019 | Freeman .......... H01L 21/76852 |
| 2004/0257749 | A1 | 12/2004 | Otsuka et al. |
| 2006/0049131 | A1 | 3/2006 | Satou |
| 2007/0030628 | A1 | 2/2007 | Yamamoto et al. |
| 2007/0064375 | A1 | 3/2007 | Urashima et al. |
| 2007/0121273 | A1 | 5/2007 | Yamamoto et al. |
| 2007/0252201 | A1 | 11/2007 | Kito et al. |
| 2009/0020744 | A1 | 1/2009 | Mizukami et al. |
| 2009/0266594 | A1 | 10/2009 | Yoshikawa |
| 2010/0133599 | A1 | 6/2010 | Chae et al. |
| 2010/0300740 | A1 | 12/2010 | Ichiyanagi et al. |
| 2011/0065272 | A1 | 3/2011 | Mizukami et al. |
| 2012/0068253 | A1 | 3/2012 | Oota et al. |
| 2012/0181701 | A1 | 7/2012 | Chen et al. |
| 2012/0261722 | A1 | 10/2012 | Tang et al. |
| 2012/0306090 | A1 | 12/2012 | Smith et al. |
| 2013/0038981 | A1 | 2/2013 | Imanaka et al. |
| 2013/0126957 | A1 | 5/2013 | Higashitani et al. |
| 2013/0285204 | A1 | 10/2013 | Saita et al. |
| 2015/0001613 | A1 | 1/2015 | Yip et al. |
| 2017/0110402 | A1 | 4/2017 | Smith et al. |
| 2017/0141121 | A1 | 5/2017 | Freeman et al. |
| 2017/0179026 | A1 | 6/2017 | Toyama et al. |
| 2017/0256588 | A1 | 9/2017 | Fukuda et al. |

FOREIGN PATENT DOCUMENTS

| | | |
|---|---|---|
| CN | 105990354 A | 5/2019 |
| CN | 107039443 A | 9/2019 |

OTHER PUBLICATIONS

Freeman et al., U.S. Application titled Integrated Structures, Capacitors and Methods of Forming Capacitors, filed Mar. 17, 2017., U.S. Appl. No. 15/451,090.

Su et al., Optimal Decoupling Capacitor Sizing and Placement for Standard-Cell Layout Designs, IEEE Transactions on Computer-Aided Design of Integrated Circuits and Systems, vol. 22, No. 4, Apr. 2003, pp. 428-436.

* cited by examiner

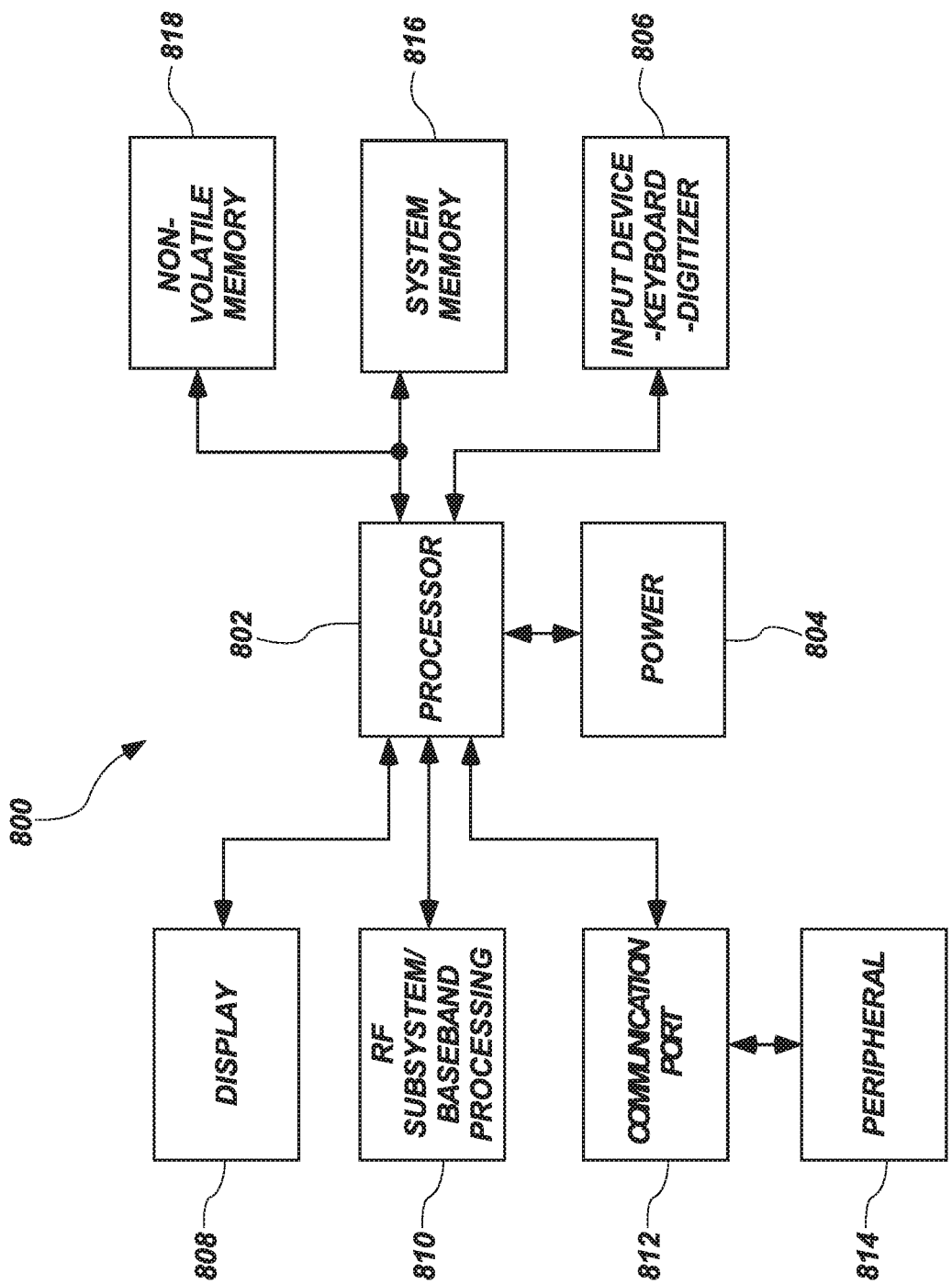

DEVICES INCLUDING VIAS EXTENDING THROUGH ALTERNATING DIELECTRIC MATERIALS AND CONDUCTIVE MATERIALS, AND RELATED ELECTRONIC DEVICES

CROSS-REFERENCE TO RELATED APPLICATION

This application is a continuation of U.S. patent application Ser. No. 16/524,994, filed Jul. 29, 2019, now U.S. Pat. No. 10,756,014, issued Aug. 25, 2020, which is a continuation of U.S. patent application Ser. No. 15/687,830, filed Aug. 28, 2017, now U.S. Pat. No. 10,373,904, issued Aug. 6, 2019, the disclosure of each of which is hereby incorporated herein in its entirety by this reference.

TECHNICAL FIELD

Embodiments disclosed herein relate to semiconductor devices including capacitors arranged in series that may be used to capacitively couple a first component to a second component of a system (e.g., a semiconductor device, an integrated circuit, etc.). More particularly, embodiments of the disclosure relate to semiconductor devices and integrated circuits including capacitors comprising a conductive via extending through alternating conductive materials and dielectric materials, to related integrated circuits and electronic systems including such semiconductor devices, and to related methods.

BACKGROUND

A continuing goal of the semiconductor industry has been to increase the memory density (e.g., the number of memory cells per memory die) of memory devices, such as non-volatile memory devices (e.g., NAND Flash memory devices). One way of increasing memory density in non-volatile memory devices is to utilize a vertical memory array (also referred to as a "three-dimensional (3D) memory array") architecture. A conventional vertical memory array includes semiconductor pillars extending through openings in tiers of conductive structures (e.g., control gates, access lines, etc.) and dielectric materials at each junction of the semiconductor pillars and the conductive structures. Such a configuration permits a greater number of transistors to be located in a unit of die surface area by building the array upwards (e.g., vertically) on a die, as compared to structures with conventional planar (e.g., two-dimensional) arrangements of transistors.

Conventional vertical memory arrays include tiers of conductive structures (e.g., access lines, word lines, etc.) separated by dielectric material. Some conventional vertical memory arrays require capacitors for operably coupling one or more components of the vertical memory array to one another, such as to reduce noise between two buses (e.g., between a power bus and a ground bus). Forming capacitors in such memory arrays requires additional real estate on the semiconductor device. In some embodiments, capacitors may be formed by directly contacting conductive word line materials to form an electrical contact, such as by forming electrical contacts to individual levels of the word line materials with a so-called "stair-step" structure. However, the stair-step structures may consume a significant amount of real estate, often larger than that available for the capacitor. In some instances, due to the real estate required to electrically contact the word lines, only a portion of the available word line levels are contacted for a capacitor structure.

In addition to requirements to increase memory density and reduce the size of memory arrays, it is a goal to reduce the footprint of other portions of semiconductor devices, such as at peripheral regions of semiconductor devices. By way of nonlimiting example, it is a goal to reduce the size of portions of a semiconductor die peripheral to a memory array, such as portions that may be coupled to sub-array features, power buses, ground buses, charge pumps, a power side decoupling capacitor, etc.

BRIEF DESCRIPTION OF THE DRAWINGS

FIG. 8 is a simplified block diagram of a system implemented according to embodiments of the disclosure.

DETAILED DESCRIPTION

Figure 1:
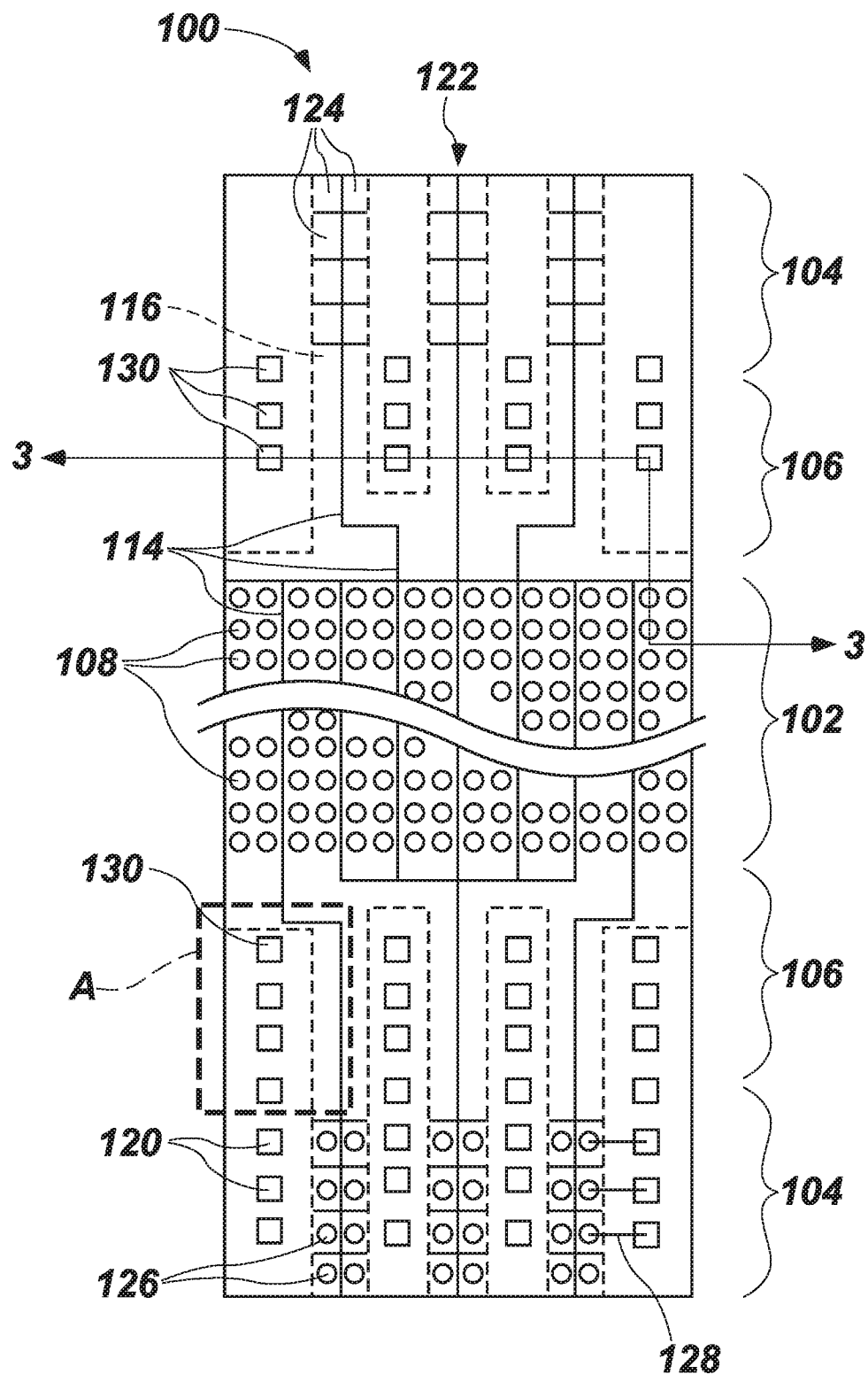
FIG. 1 is a top view of a semiconductor device including conductive vias in a via region of the semiconductor device, according to embodiments of the disclosure.

The illustrations included herewith are not meant to be actual views of any particular systems, semiconductor structures, or semiconductor devices, but are merely idealized representations that are employed to describe embodiments herein. Elements and features common between figures may retain the same numerical designation except that, for ease of following the description, for the most part, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of a capacitor structure, a semiconductor device, or an integrated circuit or a complete description of a process flow for manufacturing a capacitor structure, a semiconductor device, or an integrated circuit. The structures described below may not form complete capacitor structures, semiconductor devices, or integrated circuits. Only those process acts and structures necessary to understand the embodiments described herein are described in detail below. Additional acts to form a complete capacitor structure, semiconductor device or integrated circuit may be performed by conventional techniques.

According to embodiments disclosed herein, a semiconductor device may include a capacitor structure extending through a stack of alternating conductive materials and dielectric materials. The capacitor structure may include at least two capacitors that are operably connected in a series configuration. The capacitor structure may include a first terminal comprising a first electrically conductive lead in electrical communication with a first set of conductive lines, which may be in electrical communication with a first group of conductive vias. A second terminal of the capacitor may include a second electrically conductive lead in electrical communication with a second set of conductive lines, which may be in electrical communication with a second group of the conductive vias. The conductive vias may extend though the stack of alternating conductive material and dielectric material and may include a dielectric material on sidewalls thereof and a conductive material extending therethrough. The first group of conductive vias and the second group of conductive vias may be electrically isolated from each other (i.e., may not be in direct electrical contact with each other). For example, the first group of conductive vias and the second group of conductive vias may be isolated at least by the dielectric materials between them (e.g., the dielectric materials on sidewalls thereof). Each conductive via may define capacitors, a capacitor (e.g., at least one capacitor (e.g., two capacitors)) defined at each region (e.g., level) of the alternating conductive material through which the conductive via extends. The conductive vias of the first group may form a first capacitor and the conductive vias of the second group may form a second capacitor located in series with the first capacitor. The first electrically conductive lead may be in electrical communication with a first component of a semiconductor device and the second electrically conductive lead may be in electrical communication with a second component of the semiconductor device to capacitively couple the first component of the semiconductor device to the second component of the semiconductor device. The first component and the second component may include any component of a semiconductor device or integrated circuitry that may be electrically coupled together by a capacitor, such as, by way of nonlimiting example, one or more of a decoder (e.g., a word line decoder), an encoder, a multiplexer, a ground bus, a power bus, sensing circuitry, an amplifier, a driver, communication circuitry, or another component. The capacitor structure may comprise a charge pump, a decoupling capacitor, etc. Since the capacitor structure may extend through multiple regions (e.g., levels) of alternating dielectric material and conductive material, the capacitor structure may exhibit a relatively high capacitance (e.g., a capacitance that is proportional to the depth of the conductive vias forming the capacitor structures).

The capacitor structure may be formed in any region including high aspect ratio openings through at least some electrically conductive materials, the openings lined with a dielectric liner on sidewalls thereof and subsequently filled with a conductive material. In some embodiments, the capacitor structure may be formed in alternating regions of dielectric material and conductive material, such as in 3D NAND semiconductor devices. In some such embodiments, the capacitor structure may be formed in regions of the dielectric material and conductive material that are used to form vertical memory cells and may be electrically isolated from the memory cells. Since the capacitor structure utilizes materials that are present in the memory array, the capacitor structure may not utilize as much real estate in the semiconductor device as would conventional capacitor structures exhibiting the same capacitance of the capacitor structure. In addition, because the capacitor structure may not include a direct electrical connection to each region (e.g., level) of the alternating conductive materials of the stack, a separate electrical contact and landing pad to each region of the conductive material may not be required for the capacitor, further reducing a real estate requirement of the capacitor structure.

Figure 2:
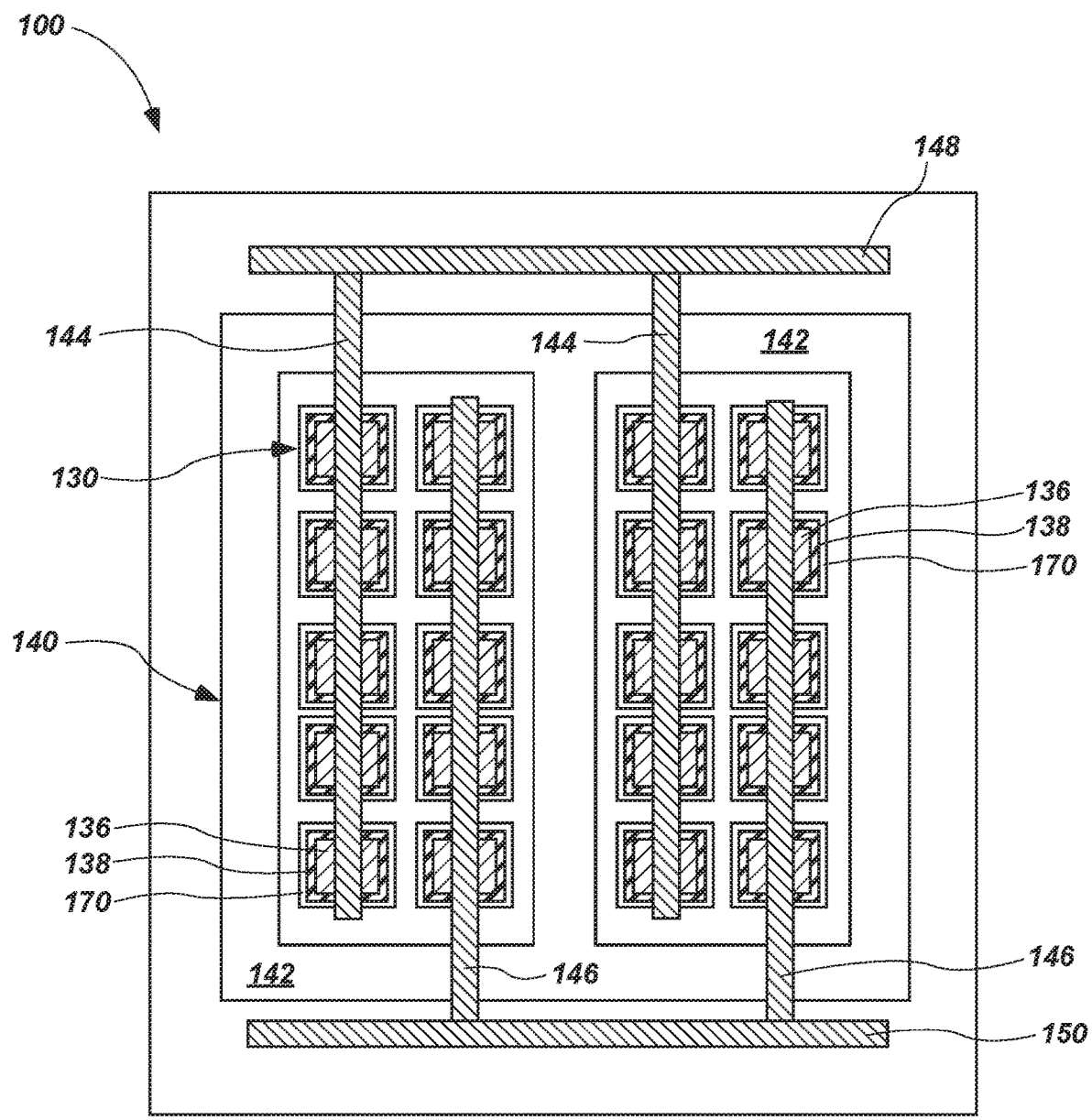
FIG. 2 is an enlarged top view of a portion of the semiconductor device of FIG. 1, taken from dashed box A of FIG. 1.
Figure 3:
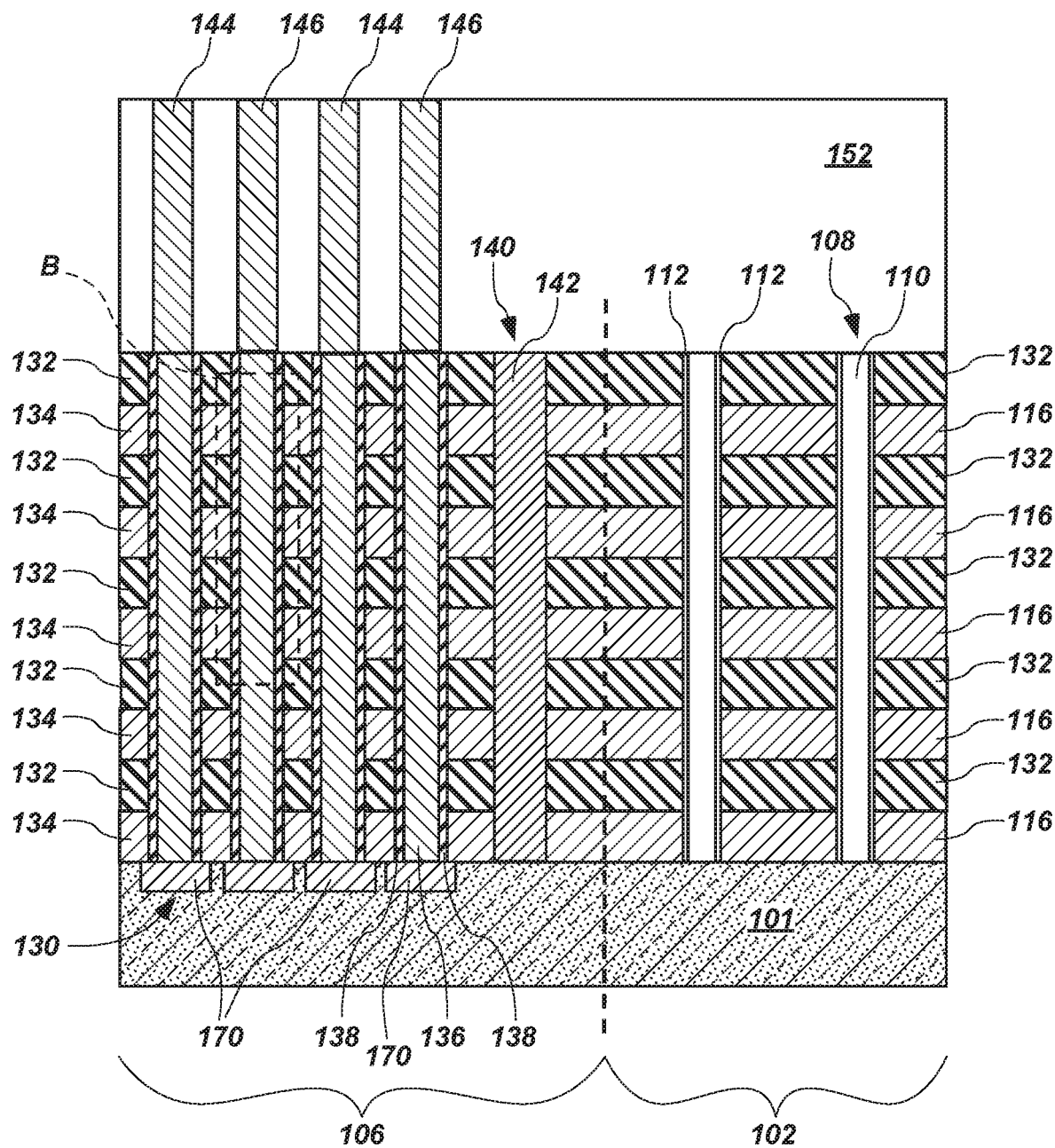
FIG. 3 is a partial cross-sectional view of the semiconductor device of FIG. 1 and FIG. 2, taken from section line 3-3 in FIG. 1.

FIG. 1 is a schematic top view of a semiconductor device 100, according to embodiments of the disclosure. The semiconductor device 100 depicted in FIG. 1 does not show all features of the semiconductor device 100 such that underlying structures and elements can be seen more clearly. FIG. 2 shows an enlarged top view of a portion of the semiconductor device 100, taken from dashed box A of FIG. 1. FIG. 3 shows a partial cross-sectional view of the semiconductor device 100 of FIG. 1, taken along section line 3-3.

Referring to FIG. 1, the semiconductor device 100 may include a memory array region 102 and a peripheral region that may include, for example, a stair-step region 104 at one or both longitudinal ends of the semiconductor device 100 and a via region 106, which may be located longitudinally between the memory array region 102 and the stair-step regions 104. Slots 114 (shown in FIG. 1 as solid lines), may be filled with a dielectric material (e.g., a silicon oxide material), and may extend through the semiconductor device 100 in the memory array region 102 proximate to and between adjacent memory cell pillars 108.

The memory array region 102 may include an array of memory cell pillars 108, each memory cell pillar 108 extending vertically through the semiconductor device 100. In some embodiments, the memory array may include a vertical NAND structure. By way of nonlimiting example, each of the memory cell pillars 108 may include a central region 110 (see FIG. 3) of a semiconductor material, such as a polysilicon or silicon-germanium material, at least partially surrounded by a charge trapping material 112 (FIG. 3), such as an oxide-nitride-oxide ("ONO") material. Memory cell pillars 108 are known in the art and are, therefore, not described in detail herein.

Electrically conductive access lines (e.g., word lines) 116 may extend along the slots 114 and may electrically couple to the memory cell pillars 108 to form individual memory cells.

The stair-step region 104 may include one or more stair-step structures 122 for electrically contacting and accessing different overlapping conductive access lines 116. The stair-step structures 122 may include contact regions 124 (e.g., "stairs") (for clarity, labeled at the top portion of FIG. 1, but also present in the bottom portion of FIG. 1) arranged like a staircase. Word line contacts 126 (for clarity, shown and labeled at the bottom portion of FIG. 1, but also present in the top portion of the semiconductor device 100 in FIG. 1) may physically and electrically contact the contact regions 124 of the stair-step structures 122 to provide electrical access to the conductive access lines 116.

In some embodiments, the stair-step region 104 includes conductive vias 120 that may extend through the semiconductor device 100. Since the conductive vias 120 extend through the semiconductor device 100, they may also be referred to as "through-array vias" or "TAVs." Electrical connections 128 may electrically connect the conductive access lines 116 to the conductive vias 120.

The conductive access lines 116 may be formed of a material with sufficient electrical conductivity to access the memory cells of the memory cell pillars 108 and to provide electrical communication between the word line contacts 126 and the electrical connections 128. By way of nonlimiting example, the conductive access lines 116 include aluminum, copper, nickel, chromium, cobalt, ruthenium, rhodium, palladium, silver, platinum, gold, iridium, tantalum, tungsten, conductive metal nitrides (e.g., TiN, TaN, WN, etc.), conductive metal silicides (e.g., tantalum silicides, tungsten silicides, nickel silicides, titanium silicides, etc.), polysilicon, and combinations thereof. In some embodiments, the conductive access lines 116 comprise tungsten.

Although the semiconductor device 100 has been illustrated as including the stair-step structures 122, it is contemplated that in other embodiments, the semiconductor device 100 does not include the stair-step structure 122.

Conductive vias 130 may be located proximate the memory array region 102, such as in the via region 106. The conductive vias 130 may be structured and configured to form a capacitor structure having a suitable capacitance for operation of the semiconductor device 100, as will be described herein.

FIG. 2 is a top view of an enlarged portion of the semiconductor device 100, illustrating dashed box A in FIG. 1. The illustrated portion of the semiconductor device 100 in FIG. 2 corresponds to the via region 106 in FIG. 1. FIG. 3 is a simplified cross-sectional view of a portion of the semiconductor device 100 taken along section line 3-3 in FIG. 1.

Referring to FIG. 3, the memory cell pillars 108 may vertically extend through a stack of alternating conductive access lines 116 and dielectric materials 132 disposed over a substrate 101. An individual memory cell may be formed at each junction between the respective conductive access lines 116 and memory cell pillars 108.

The substrate 101 may be a semiconductor substrate, a base semiconductor material on a supporting substrate, a metal electrode, or a semiconductor substrate having one or more materials, structures, or regions formed thereon. The substrate 101 may be a conventional silicon substrate or other bulk substrate including semiconductor material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium (Sii-xGex, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form material, regions, or junctions in the base semiconductor structure or foundation. The substrate 101 may include one or more materials associated with integrated circuitry fabrication. Such materials may include, for example, one or more refractory metals, barrier materials, diffusion materials, insulative materials, etc. The substrate 101 may include, for example, complementary metal oxide semiconductor (CMOS) structures, or other semiconductor structures.

The via region 106 may be electrically isolated from other portions of the semiconductor device 100 by one or more trenches 140 that may be filled with an electrically insulative material (e.g., a dielectric material) 142. The insulative material 142 may include silicon oxide (e.g., silicon dioxide), silicon nitride (e.g., $Si_3N_4$), silicon oxynitride, spin-on dielectric materials, tetraethyl orthosilicate (TEOS), borophosphosilicate (BPS), phosphosilicate glass (PSG), and combinations thereof.

The via region 106 may include the conductive vias 130, which may extend through the semiconductor device 100. The conductive vias 130 may be electrically isolated from the memory array region 102 and from other portions of the semiconductor device 100 by one or more of the trenches 140. In some embodiments, the trench 140 may extend from a surface of the semiconductor device 100 to the substrate 101 over which the memory cell pillars 108 and the conductive via 130 may be formed. In other embodiments, the trench 140 may extend only partially through the semiconductor device 100.

In some embodiments, one or more trenches 140 may electrically isolate one or more groups of conductive vias 130. In some embodiments, the conductive vias 130 may be disposed within an enclosure defined by the trenches 140, as illustrated in FIG. 2. However, the disclosure is not so limited and the conductive vias 130 may be separated from the memory array region 102 by, for example, only one trench 140 between the conductive vias 130 and the memory array region 102. In some such embodiments, the trench 140 may extend between only the memory array region 102 and the via region 106.

The conductive vias 130 may be disposed over a source material 170 (FIG. 2), such as a source select gate material that may be used in a NAND semiconductor device. The source material 170 may include a conductive material such as, for example, polysilicon.

The conductive vias 130 may be arranged in rows and columns within the via region 106. Although FIG. 2 illustrates five rows of conductive vias 130 and four columns of conductive vias 130, the disclosure is not so limited. In other embodiments, the semiconductor device 100 may include fewer or more conductive vias 130, depending on a particular application (e.g., a desired capacitance) for the conductive vias 130.

The conductive vias 130 in at least some of the columns of the conductive vias 130 may be in electrical communication with each other via one or more first conductive lines 144. Conductive vias 130 in at least other of the columns of conductive vias 130 may be in electrical communication with each other via one or more second conductive lines 146. The first conductive lines 144 may be in electrical communication with a first electrically conductive lead 148 and the second conductive lines 146 may be in electrical communication with a second electrically conductive lead 150. For example, a first group of conductive vias 130 may be in electrical communication with the first electrically conductive lead 148 and at least a second group of conductive vias 130 may be in electrical communication with the second electrically conductive lead 150. In some embodiments, about half of the conductive vias 130 are in electrical communication with the first conductive lines 144 and about half of the conductive vias 130 are in electrical communication with the second conductive lines 146. In some such embodiments, capacitors formed from the first group of the conductive vias 130 may exhibit substantially the same capacitance as capacitors formed from the second group of conductive vias 130.

Although FIG. 2 illustrates that every other column of conductive vias 130 is in electrical communication with a first conductive line 144 and the other columns of conductive vias 130 are in electrical communication with a second conductive line 146, the disclosure is not so limited. In other embodiments, electrical contacts between the conductive vias 130 and the first conductive lines 144 and second conductive lines 146 may be other than those illustrated.

Although FIG. 2 illustrates that rows and columns of the conductive vias 130 are arranged perpendicular to each other, the disclosure is not so limited. In some embodiments, the conductive vias 130 may be arranged in rows and columns that may not be arranged parallel or perpendicular to each other. By way of nonlimiting example, the conductive vias 130 may be arranged in rows that are oriented at an angle other than about 90° with respect to columns of the conductive vias 130. In other embodiments, the conductive vias 130 may be arranged in a random pattern.

Although FIG. 2 illustrates the conductive vias 130 as having a square shape, the disclosure is not so limited. In other embodiments, the conductive vias 130 may have a circular shape or another shape.

Referring to FIG. 3, the conductive vias 130 may include a conductive material 136 extending through openings formed in a stack of alternating regions (e.g., levels) of conductive materials 134 and the dielectric materials 132. The conductive vias 130 may extend through the stack of alternating regions of conductive materials 134 and alternating dielectric materials 132 in a direction that is substantially perpendicular to a direction in which the alternating conductive materials 134 and alternating dielectric materials 132 extend.

Each region of conductive material 134 may be disposed over a region of the dielectric material 132, which in turn, may be disposed over another region of the conductive material 134. Stated another way, each region of conductive material 134 may be disposed between regions of the dielectric material 132 and each region of the dielectric material 132 may be disposed between regions of the conductive material 134.

The conductive material 134 may include the same material as the conductive access lines 116. By way of nonlimiting example, the conductive material 134 may include aluminum, copper, nickel, chromium, cobalt, ruthenium, rhodium, palladium, silver, platinum, gold, iridium, tantalum, tungsten, conductive metal nitrides (e.g., TiN, TaN, WN, etc.), conductive metal silicides (e.g., tantalum silicides, tungsten silicides, nickel silicides, titanium silicides, etc.), polysilicon, and combinations thereof. In some embodiments, the conductive material 134 comprises tungsten. As will be described herein, the conductive material 134 may be formed concurrently with formation of the conductive access lines 116.

A dielectric material 138 may overlie sidewalls of the conductive via 130. The dielectric material 138 may also be referred to herein as a "dielectric liner." The dielectric material 138 may be disposed between the conductive material 136 and each of the regions of the dielectric material 132 and the conductive material 134. Stated another way, the dielectric material 138 may separate and electrically insulate the conductive material 136 of each conductive via 130 from the alternating regions of the conductive material 134.

The dielectric material 138 may include any material for electrically insulating the conductive material 134 of the regions of conductive material 134 from the conductive material 136 of the conductive vias 130. By way of non-limiting example, the dielectric material 138 may include silicon oxide (e.g., silicon dioxide), silicon nitride (e.g., $Si_3N_4$), silicon oxynitride, spin-on dielectric materials, tetraethyl orthosilicate (TEOS), borophosphosilicate (BPS), phosphosilicate glass (PSG), and combinations thereof. In some embodiments, the dielectric material 138 includes the same material as the dielectric material 132 of the alternating regions of dielectric material 132. In some embodiments, the dielectric material 138 includes silicon dioxide.

An insulative material 152 may overlie the conductive vias 130 and the memory cell pillars 108. With reference to FIG. 2 and FIG. 3, the first conductive lines 144 and the second conductive lines 146 may extend through the insulative material 152 (not shown in FIG. 2 for clarity). As described above and as illustrated in FIG. 2, the first conductive lines 144 may be electrically connected to the first electrically conductive lead 148 and the second conductive lines 146 may be electrically connected to the second electrically conductive lead 150.

FIG. 3 illustrates five overlying regions (e.g., levels) of conductive material 134 in the via region 106 (and five conductive access lines 116 in the memory array region 102) and five overlying first dielectric materials 132. Thus, the semiconductor device 100 shown in FIG. 3 has five tiers. However, the present disclosure is not limited to semiconductor devices 100 having five tiers. Rather, the semiconductor device 100 may include any number of tiers, such as at least about 16, at least about 32, at least about 36, at least about 64, at least about 72, or at least about 128 tiers. In other words, in some embodiments, the semiconductor device 100 may include at least about 128 sets of alternating conductive material 134 and dielectric material 132 (e.g., at least about 128 regions of conductive material 134 and about 128 regions of dielectric material 132). Similarly, the semiconductor device 100 may include at least about 128 sets of alternating conductive access lines 116 and dielectric material 132. In some embodiments, the semiconductor device 100 includes the same number of tiers in the memory array region 102 as the number of tiers in the via region 106.

In some embodiments, a total number of tiers of the semiconductor device 100 may have a height of about 4 μm or greater, such as at least about 4 μm, at least about 6 μm, or at least about 8 μm. Accordingly, in some such embodiments, the conductive vias 130 may extend through at least about 4 μm or more of alternating regions of conductive materials 134 and dielectric materials 132.

Although FIG. 2 illustrates that the first conductive lines 144, the second conductive lines 146, the first electrically conductive lead 148, and the second electrically conductive lead 150 extend over the conductive vias 130, the disclosure is not so limited. In other embodiments, the first conductive lines 144, the second conductive lines 146, the first electrically conductive lead 148, and the second electrically conductive lead 150 may electrically contact the conductive vias 130 through the substrate 101. In some embodiments, the first conductive lines 144 may extend over the conductive vias 130 and the second conductive lines 146 may extend below the conductive vias 130.

Figure 4:
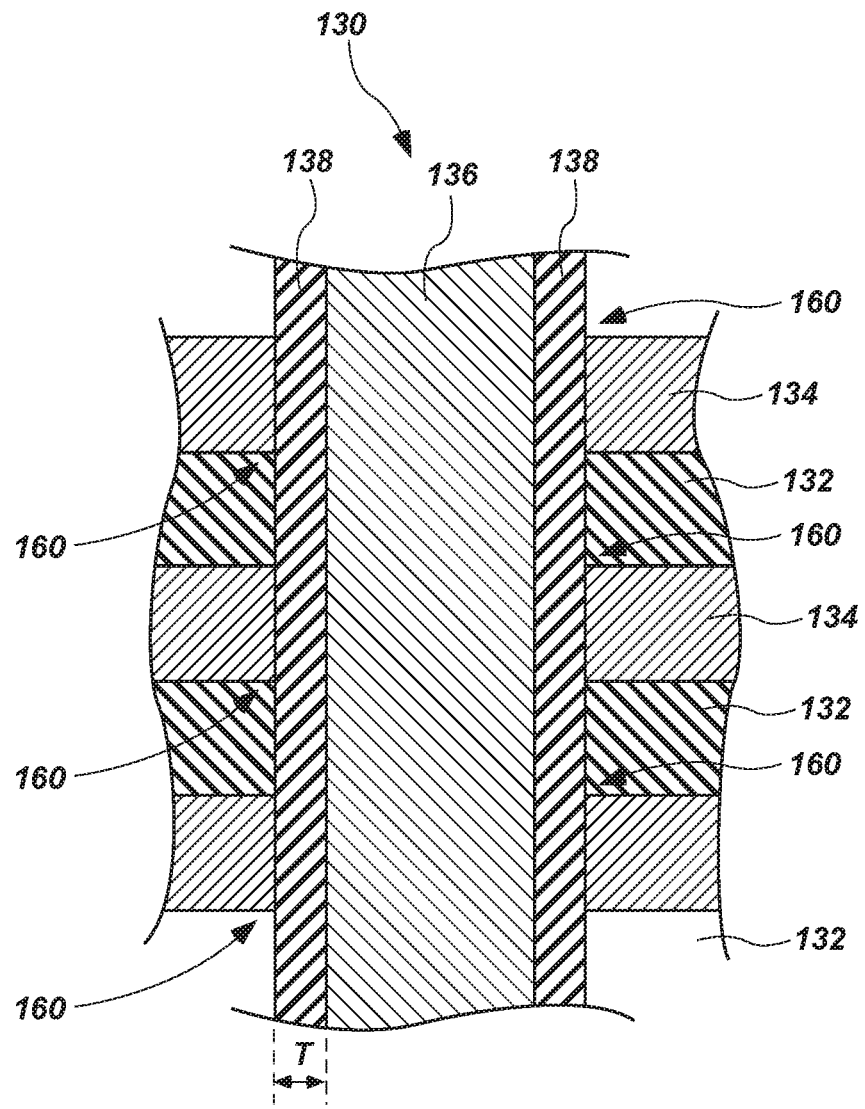
FIG. 4 is a detailed cross-sectional view of a portion of the semiconductor device of FIG. 1 through FIG. 3, taken from dashed box B in FIG. 3.

FIG. 4 is an enlarged portion illustrating a cross-section of a conductive via 130. The conductive via 130 extending through the dielectric materials 132 and the conductive materials 134 may form a plurality of capacitors 160 that may be arranged in series with respect to each other. Each capacitor 160 may be defined by the conductive material 136 of the conductive via 130, the dielectric material 138 on sidewalls of the conductive via 130, and each region of the conductive material 134. Since each conductive material 134 region is separated from other conductive material 134 regions by the dielectric material 132 regions, each region of the conductive material 134 may define one or more capacitors 160 distinct from and electrically insulated from capacitors 160 of other regions of the conductive material 134. In other words, each capacitor 160 may be defined by a capacitor plate comprising a portion of the conductive material 136 of the conductive via 130, a dielectric material comprising the dielectric material 138, and another capacitor plate comprising a region of the conductive material 134. A conductive material 134 between adjacent conductive vias 130 may comprise a capacitor plate of two separate capacitors 160.

A number of capacitors 160 associated with each conductive via 130 may correspond to a number of conductive material 134 regions through which the conductive via 130 extends. By way of nonlimiting example, there may be two capacitors 160 associated with the conductive via 130 for each region of conductive material 136 through which the conductive via 130 extends (e.g., one on each side of the conductive via 130). Accordingly, there are six capacitors 160 illustrated in the cross-sectional view of FIG. 4. Since each conductive via 130 may extend through, for example, 128 conductive material 134 regions, there may be 256 capacitors 160 associated with each conductive via 130. Accordingly, the conductive material 136 of the conductive via 130 may be capacitively coupled to each conductive material 134 region through the dielectric material 138 on the sidewalls of the conductive via 130. Each capacitor 160 associated with a particular conductive via 130 may be capacitively coupled to other capacitors 160 associated with the same conductive via 130 in a series configuration.

A thickness T of the dielectric material 138 on sidewalls of the conductive via 130 may be sufficient to provide electrical stability at voltages to which the capacitors 160 may be subjected during use and operation. In some embodiments, the dielectric material 138 may be subjected to a voltage as high as about 30 V. The thickness of the dielectric material 138 may be between about 10 nm and about 50 nm, such as between about 10 nm and about 20 nm, between about 20 nm and about 30 nm, between about 30 nm and about 40 nm, or between about 40 nm and about 50 nm. In some embodiments, the thickness of the dielectric material 138 may be between about 25 nm and about 35 nm, such as about 30 nm.

Although FIG. 1 through FIG. 3 have depicted the conductive vias 130 as being located in the array region 106, the disclosure is not so limited. In other embodiments, the conductive vias 130 may be located in the memory array region 102, the stair-step region 104, or both. In some embodiments, at least some of the conductive vias 130 may be located in the via region 106, at least some of the conductive vias 130 may be located in the stair-step region 104 or the memory array region 102.

Figure 5A:
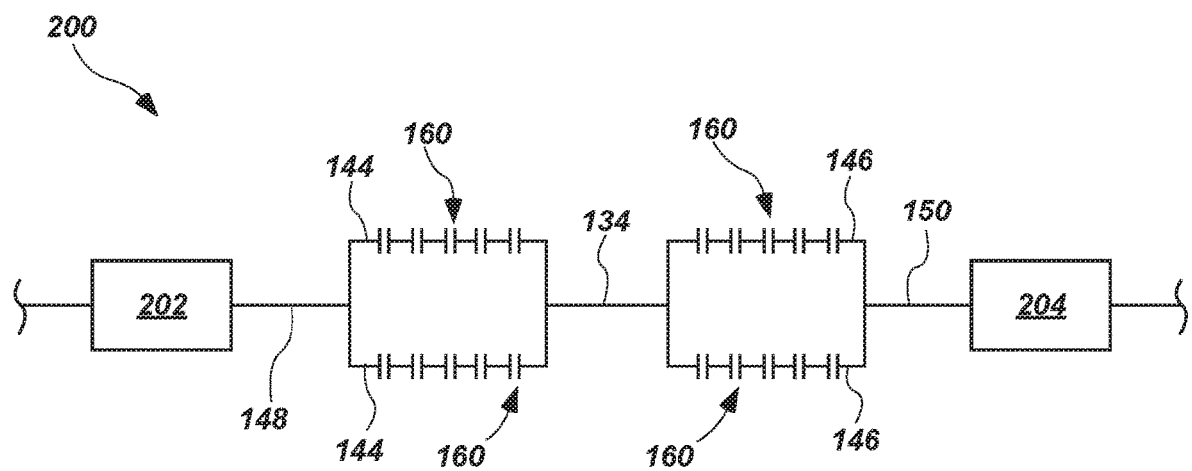
FIG. 5A and FIG. 5B are simplified schematics illustrating a capacitor structure formed by capacitors, according to embodiments of the disclosure.

FIG. 5A is a simplified schematic illustrating a capacitor structure 200 that may be formed by the capacitors 160 (FIG. 4) of the conductive vias 130. The capacitor structure 200 may include the first electrically conductive lead 148 that may be operably coupled to a first component 202 of integrated circuitry. The first electrically conductive lead 148 may be in electrical communication with one or more of the first conductive lines 144, which in turn, may be operably coupled to one or more conductive vias 130 (FIG. 3, FIG. 4).

As described above, each conductive via 130 may comprise a portion of capacitors 160, each capacitor 160 comprising a portion of the conductive material 136 of the conductive via 130, the dielectric material 138, and the conductive material 134 of each region. The first conductive lines 144 may be in electrical communication with the second conductive lines 146 through the conductive materials 134. Stated another way, each capacitor 160 located along a conductive material 136 of a conductive via 130 may be in electrical communication with a respective conductive material 134 since the conductive material 134 may comprise a capacitor plate of the respective capacitor.

The second conductive lines 146 may be in electrical communication with the second electrically conductive lead 150, which may be in electrical communication with a second component 204 of the integrated circuitry.

In use and operation, a current may flow from the first component 202 to the first electrically conductive lead 148. The current may flow from the first electrically conductive lead 148 to one or more of the first conductive lines 144, which may be arranged in a parallel configuration with respect to each other. The current may flow from each first conductive line 144 through one or more conductive vias 130 in electrical communication with the respective first conductive line 144.

Since each conductive via 130 includes a plurality of capacitors 160 formed by the conductive material 136 extending through the conductive via 130, the dielectric material 138, and the conductive material 134, each conductive via 130 may exhibit a capacitance that is equivalent to a capacitance of the plurality of capacitors 160 arranged in a series configuration. Since the first conductive lines 144 are arranged in parallel with respect to each other, the conductive vias 130 in electrical communication with the first conductive lines 144 may exhibit a capacitance of capacitors arranged in a parallel configuration.

The electrical current may flow through each conductive material in the stack of alternating conductive materials 134 to an adjacent conductive via 130. The adjacent conductive vias 130 may exhibit a similar configuration as the conductive vias 130 in electrical communication with the first conductive lines 144, but may be in electrical communication with the second conductive lines 146.

Since the adjacent conductive vias 130 include a plurality of capacitors 160 formed by the conductive material 136 extending through the conductive via 130, the dielectric material 138, and the conductive material 134 regions, each conductive via 130 in electrical communication with the second conductive lines 146 may exhibit a capacitance that is equivalent to a capacitance of capacitors arranged in series, similar to the conductive vias 130 in electrical communication with the first conductive lines 144. Since the second conductive lines 146 are arranged in parallel with respect to each other, the conductive vias 130 in electrical communication with the second conductive lines 146 may exhibit a capacitance of capacitors arranged in a parallel configuration. Accordingly, with reference to FIG. 5B, a first capacitor 162 may be capacitively coupled to a second capacitor 164 in series. The first capacitor 162 may be defined by the capacitors 160 in electrical communication with the first conductive lines 144 and the first electrically conductive lead 148 and the second capacitor 164 may be defined by the capacitors 160 in electrical communication with the second conductive lines 146 and the second electrically conductive lead 150.

The current may flow through the second conductive lines 146 to the second electrically conductive lead 150, which may be in electrical communication with the second component 204. The second component 204 may include a component that may be used in integrated circuitry of a semiconductor device that may be capacitively coupled to the first component 202 through the capacitor structure 200. By way of nonlimiting example, each of the first component 202 and the second component 204 may independently comprise a decoder, an encoder, a multiplexer, a ground bus, a power bus, sensing circuitry, an amplifier, a driver, communication circuitry, another component of a semiconductor device, and combinations thereof.

The capacitor structure 200 may be used in the semiconductor device 100 (FIG. 1) and integrated circuitry used to capacitively couple components of the semiconductor device 100 together. By way of nonlimiting example, the capacitor structure 200 may comprise a decoupling capacitor (e.g., an on-chip decoupling capacitor) that may be coupled between, for example, a power supply bus and a ground bus. In other embodiments, the capacitor structure 200 may be used as a charge pump. However, the disclosure is not so limited and the capacitor structure 200 may be used to capacitively couple any two components of integrated circuitry.

The capacitor structure 200 may exhibit a capacitance that is proportional to the number of regions of conductive material 134 through which the conductive vias 130 extend and to the number of the conductive vias 130. Since a current may flow from the first electrically conductive lead 148 to the second electrically conductive lead 150, the regions of the conductive material 134 may not be electrically contacted to a power source. Accordingly, the conductive material 134 regions may form capacitor structures without forming individual electrical contacts to each conductive material 134 region (such as with a stair-step structure) as may be required in conventional capacitor structures. In other words, individual regions of the conductive material 134 may not be wired. In some such embodiments, the conductive material 134 regions may be said to be so-called "floating" conductive material 134 regions. Accordingly, each region of the conductive material 134 may be directly contacted and substantially surrounded by a dielectric material (e.g., the regions of dielectric material 132, the dielectric material 142 of the trench 140, or another dielectric material.

Accordingly, the electrical current may flow from a capacitor structure 200 of a conductive via 130 in electrical communication with the first electrically conductive lead 148 to a capacitor structure 200 of a second conductive via 130 in electrical communication with the second electrically conductive lead 150 through the conductive material 134 region. In other words, the conductive material 134 region may bridge capacitors 160 of adjacent conductive vias 130, which adjacent conductive vias 130 may be in electrical communication with a different one of the first electrically conductive lead 148 and the second electrically conductive lead 150. In some embodiments, as a number of conductive access lines 116 of a memory cell array increases, the capacitor structure 200 may be formed with a greater capacitance without requiring additional real estate, since the capacitance of the structure may increase with an increasing number of regions of the conductive material 134 region.

In some embodiments, the capacitor structure 200 may exhibit a capacitance per unit area of between about 2 femtofarads (fF)/μm$^2$ and about 10 fF/μm$^2$, such as between about 2 fF/μm$^2$ and about 4 fF/μm$^2$, between about 4 fF/μm$^2$ and about 6 fF/μm$^2$, between about 6 fF/μm$^2$ and about 8 fF/μm$^2$, or between about 8 fF/μm$^2$ and about 10 fF/μm$^2$. Since the capacitor structure 200 may include a plurality of capacitors arranged in a series configuration, the capacitance per unit area of the capacitor structure 200 may increase with an increasing depth of the conductive vias 130.

Figure 5B:
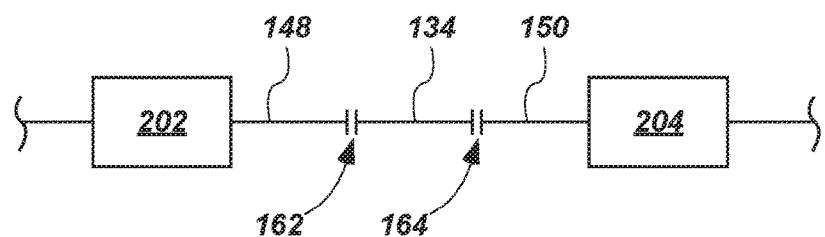

Accordingly, the stack of alternating conductive materials 134 and dielectric materials 132 may be used in the via region 106 (FIG. 1) to form the capacitor structure 200 (FIG. 5A, FIG. 5B). The alternating conductive materials 134 may comprise the same material as the conductive access lines 116 (FIG. 3) that may be used to access individual memory cells of the memory cell pillars 108 (FIG. 3) in the memory array region 102. By way of comparison, conventional semiconductor devices may require additional space and materials to form a capacitor. For example, conventional semiconductor device may require additional real estate to form a capacitor structure. The capacitor structure 200 may be formed directly proximate the memory array region 102 and may include the same materials that are used to form the memory array region 102, such as the memory cell pillars 108.

In some embodiments, since the capacitor structure 200 includes the first capacitor 162 and the second capacitor 164 arranged in series, the capacitor structure 200 may exhibit a substantial capacitance, even if a dielectric material 138 of a conductive via 130 fails.

Accordingly, in some embodiments, a semiconductor device comprises a capacitor structure comprising conductive vias extending through a stack of alternating dielectric materials and first conductive materials, each conductive via comprising a second conductive material extending through the stack within another dielectric on a sidewall of the conductive via, a first conductive line in electrical communication with a first group of the conductive vias, and a second conductive line in electrical communication with a second group of the conductive vias.

Accordingly, in some embodiments, a semiconductor device comprises a first component of an integrated circuit, a second component of the integrated circuit, and a capacitor structure between the first component of the integrated circuit and the second component of the integrated circuit. The capacitor structure comprises conductive vias extending through alternating first dielectric materials and first conductive materials, each conductive via including a second dielectric material on a sidewall thereof and a central portion comprising a second conductive material, and capacitors each defined by a portion of the second conductive material, the second dielectric material, and one region of the first conductive material.

Figure 6A:
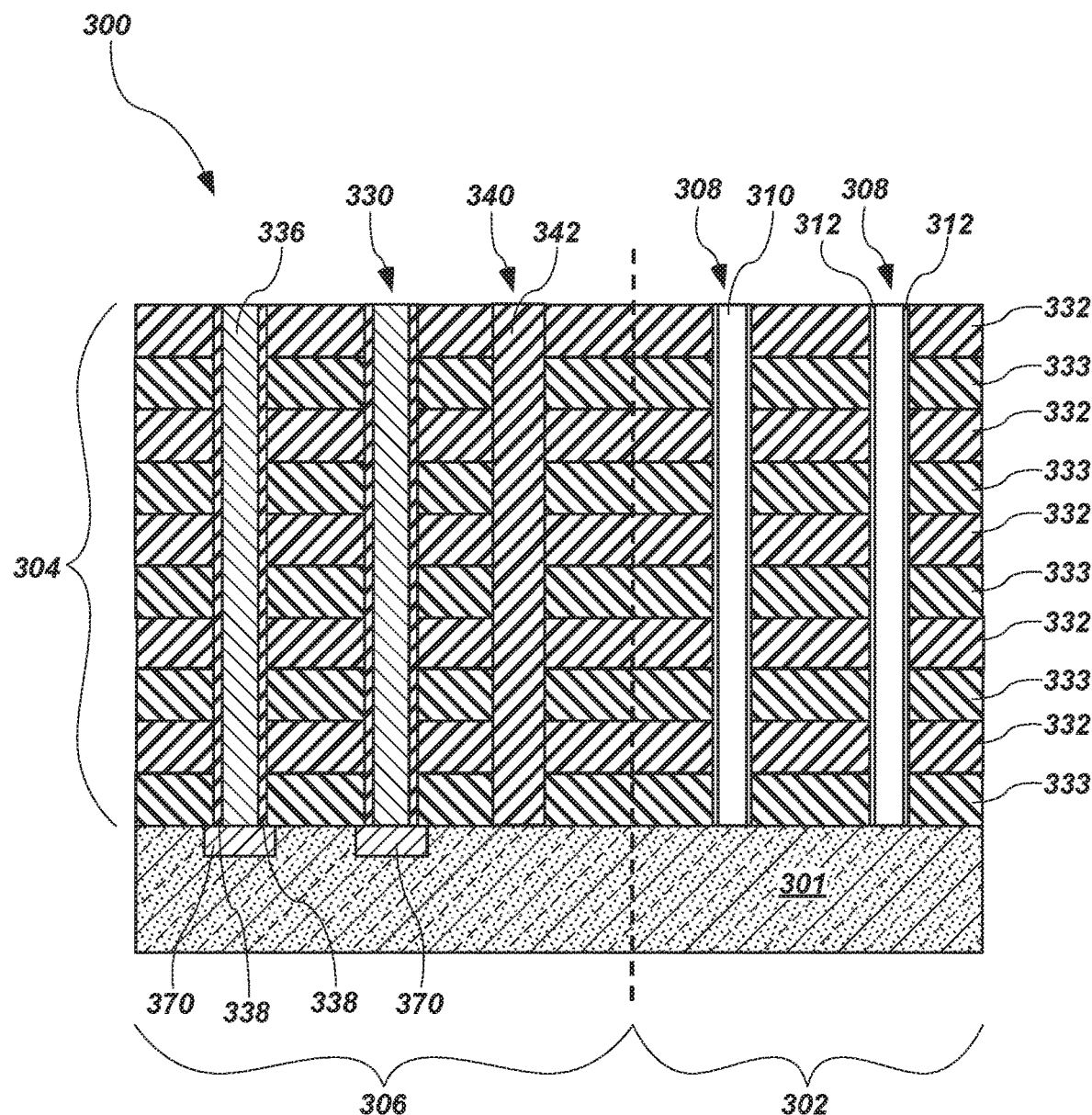
FIG. 6A and FIG. 6B are cross-sectional views of a semiconductor device illustrating a method of forming the semiconductor device, according to embodiments of the disclosure.
Figure 6B:
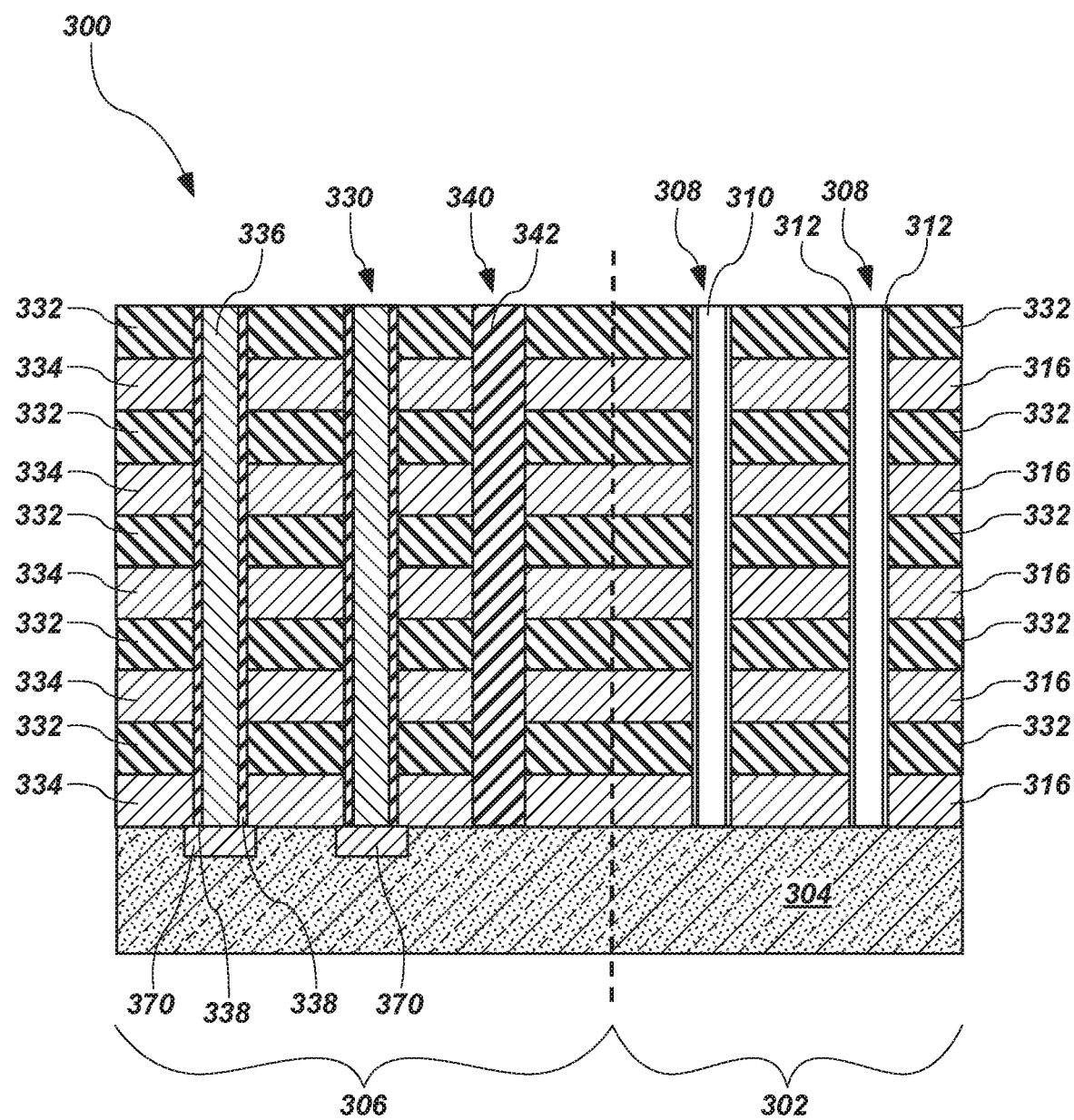

FIG. 6A and FIG. 6B illustrate a method of forming the capacitor structure 200 (FIG. 5A, FIG. 5B). FIG. 6A is a cross-sectional view of a semiconductor device 300 including a stack 304 of alternating first dielectric materials 332 and second dielectric materials 333 arranged in regions formed over a substrate 301, which may be the same as the substrate 101 described above with reference to FIG. 3. The first dielectric material 332 may be, for example, an oxide material, such as silicon dioxide. The second dielectric material 333 may be, for example, a nitride material exhibiting an etch selectivity with respect to the first dielectric material 332, such as silicon nitride. The stack 304 may extend over a memory array region 302 and at least a via region 306 of the semiconductor device 300. The materials of the capacitor structure 200 may be formed by conventional techniques including, but not limited to, atomic layer deposition (ALD), chemical vapor deposition (CVD), physical vapor deposition (PVD), plasma enhanced chemical vapor deposition (PECVD), low pressure chemical vapor deposition (LPCVD), or other suitable process.

Memory cell pillars 308 may be formed in the memory array region 302, each of which memory cell pillars 308 may include a central region 310 of a semiconductor material, surrounded by a charge trapping material 312. By way of nonlimiting example, the memory cell pillars 308 may be formed by anisotropically removing (e.g., etching) portions of the first dielectric material 332 and second dielectric material 333 to form openings (e.g., holes) through the stack 304, after which the charge trapping material 312 may be formed along sidewalls defining the openings. The charge trapping material 312 may include, for example, an oxide, a nitride, and an oxide material (e.g., an "ONO" material). A semiconductor material may be disposed in the remaining portions of the openings to fill the openings and form the central region 310 of the memory cell pillars 308.

Conductive vias 330 may be formed in the via region 306, each of which may include a conductive material 336 disposed therein and a dielectric material 338 on sidewalls thereof. By way of nonlimiting example, the conductive vias 330 may be formed by anisotropically removing (e.g., etching) portions of the first dielectric material 332 and the second dielectric material 333 to form openings through the stack 304 in the via region 306. In some embodiments, the portions of the first dielectric material 332 and the second dielectric material 333 may be removed from the via region 306 at the same time as portions of the first dielectric material 332 and the second dielectric material 333 are removed from the memory array region 302. The conductive vias 330 may be formed on landing pads of a source material 370, which may be substantially the same as the source material 170 described above with reference to FIG. 2 and FIG. 3.

After forming the openings in the via region 306, a dielectric material 338 may be formed along sidewalls defining the holes through the stack 304. The dielectric material 338 may include the same material as the first dielectric material 332. In some embodiments, the dielectric material 338 may include silicon dioxide. After forming the dielectric material 338 in the openings in the via region 306, the conductive material 336 may be formed in the remaining openings to form the conductive vias 330.

Optionally, an opening may be formed between the memory array region 302 and the via region 306 and filled with an insulative material 342 to form a filled trench 340. In some embodiments, the filled trench 340 may be formed concurrently with forming the openings of the memory cell pillars 308 and the conductive vias 330.

FIG. 6B is a cross-sectional view of the semiconductor device 300 after removing the second dielectric material 333 to form a gap for conductive access lines. By way of nonlimiting example, slots (e.g., slots 114 (FIG. 1)) may be formed through the stack 304 and the second dielectric material 333 may be removed through slots, such as by an isotropic material removal process that selectively removes the second dielectric material 333 relative to the first dielectric material 332, the charge trapping material 312, and the dielectric material 338. Such isotropic removal processes are known in the art and, therefore, are not described in detail herein. The material removal process may form gaps between the first dielectric materials 332.

The gaps may be filled with a conductive material to form alternating conductive material 334 in the via region 306 and conductive access lines 316 in the memory array region 302. The conductive material may include any of the materials described above with reference to the conductive access lines 116 and the conductive materials 134 described above with reference to FIG. 1 through FIG. 3. For example, the conductive material may include aluminum, copper, nickel, chromium, cobalt, ruthenium, rhodium, palladium, silver, platinum, gold, iridium, tantalum, tungsten, conductive metal nitrides (e.g., TiN, TaN, WN, etc.), conductive metal silicides (e.g., tantalum silicides, tungsten silicides, nickel silicides, titanium silicides, etc.), polysilicon, and combinations thereof. In some embodiments, the conductive material may include tungsten.

Since the second dielectric material 333 is replaced with the conductive access lines 316 and the conductive materials 334, the process may be referred to as a so-called "gate replacement" process.

After forming the conductive access lines 316 and the conductive materials 334, conductive lines (e.g., the first conductive lines 144 (FIG. 2) and the second conductive lines 146 (FIG. 2) may be formed. For example, first conductive lines may be formed in electrical communication with a first group of conductive vias 330 and second conductive lines may be formed in electrical communication with a second group of conductive vias 330. In some embodiments, a dielectric material may be formed over the semiconductor device 300 and patterned to form openings over the conductive vias 130. A first electrically conductive lead (e.g., first electrically conductive lead 148 (FIG. 2)) may be formed in electrical contact with the first group of the conductive vias 330 through the first conductive lines and a second electrically conductive lead (e.g., second electrically conductive lead 150 (FIG. 2)) may be formed in electrical contact with the second group of the conductive vias 330 through the second conductive lines. The first electrically conductive lead may be operably coupled to a first component of the semiconductor device and the second electrically conductive lead may be operably coupled to a second component of the semiconductor device to capacitively couple the first component and the second component.

Although the method described above with reference to FIG. 6A and FIG. 6B has been described as including forming a stack 304 including the alternating first dielectric materials 332 and second dielectric materials 333, forming the conductive vias 330 and the memory cell pillars 308, removing the second dielectric materials 333, and forming the conductive material 334 regions and the conductive access lines 316, the disclosure is not so limited. In other embodiments, the semiconductor device 300 may be formed by a so-called "floating gate" method wherein a stack including alternating dielectric materials and conductive materials are formed over a substrate. The conductive vias 330 and the memory cell pillars 308 may be formed through the stack by anisotropically removing portions of the dielectric material and the conductive material to form holes in the stack in the via region 306 and the memory array region 302. Thereafter, the memory cell pillars 308 may be formed and the conductive vias 330 may be formed as described above. Such a process may be referred to as a so-called "floating gate" process.

Accordingly, in some embodiments, a method of forming a capacitor structure in a semiconductor device comprises forming a stack comprising alternating first dielectric materials and second dielectric materials, forming openings in the stack in a memory array region and in a via region of the semiconductor device, selectively removing portions of the second dielectric materials from the stack to form gaps between adjacent portions of the alternating first dielectric materials, forming a first conductive material in the gaps, forming a dielectric material on a sidewall of the openings in the via region, and forming a second conductive material in the openings of the via region over the dielectric material to form conductive vias comprising a portion of a capacitor structure comprising the second conductive material, the dielectric material on the sidewall of the conductive via, and the first conductive material.

Figure 7:
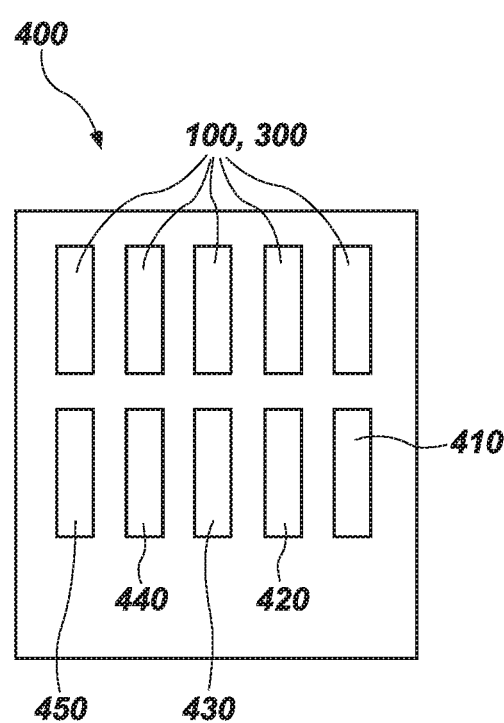
FIG. 7 is a simplified schematic of a system including at least one semiconductor device, according to embodiments of the disclosure.

FIG. 7 is a simplified schematic of a system 400 that may include one or more of the semiconductor devices 100, 300 described above. The system 400 may also include additional elements, such as communication circuitry 410, drivers 420, a memory controller 430, an amplifier 440, and a decoder 450, for example. In some embodiments, one or more of the additional elements may be formed under the semiconductor devices 100, 300 and electrically contacted using through-array vias. A semiconductor system may include the system 400 as described herein.

With reference to FIG. 8, depicted is a processor-based system 800. The processor-based system 800 may include various electronic devices manufactured in accordance with embodiments of the present disclosure. The processor-based system 800 may be any of a variety of types such as a computer, camera, pager, cellular phone, wireless device, display, chip set, set-top box, personal organizer, control circuit, or other electronic device. The processor-based system 800 may include one or more processors 802, such as a microprocessor, to control the processing of system functions and requests in the processor-based system 800. The processor 802 and other subcomponents of the processor-based system 800 may include or be coupled to memory cells, memory arrays, and semiconductor devices including the semiconductor devices 100, 300 described herein in accordance with embodiments of the present disclosure.

The processor-based system 800 may include a power supply 804 in operable communication with the processor 802. For example, if the processor-based system 800 is a portable system, the power supply 804 may include one or more of a fuel cell, a power scavenging device, permanent batteries, replaceable batteries, and rechargeable batteries. The power supply 804 may also include an AC adapter; therefore, the processor-based system 800 may be plugged into a wall outlet, for example. The power supply 804 may also include a DC adapter such that the processor-based system 800 may be plugged into a vehicle cigarette lighter receptacle or a vehicle power port, for example.

Various other devices may be coupled to the processor 802 depending on the functions that the processor-based system 800 performs. For example, a user interface 806 may be coupled to the processor 802. The user interface 806 may include input devices such as buttons, switches, a keyboard, a light pen, a mouse, a digitizer and stylus, a touch screen, a voice recognition system, a microphone, or a combination thereof. A display 808 may also be coupled to the processor 802. The display 808 may include a liquid crystal display (LCD), a surface-conduction electron-emitter display (SED), a cathode ray tube (CRT) display, a digital light processing (DLP) display, a plasma display, an organic light-emitting diode (OLED) display, a light emitting diode (LED) display, a three-dimensional projection, an audio display, or a combination thereof. Furthermore, an RF sub-system/baseband processor 810 may also be coupled to the processor 802. The RF sub-system/baseband processor 810 may include an antenna that is coupled to an RF receiver and to an RF transmitter (not shown). A communication port 812, or more than one communication port 812, may also be coupled to the processor 802. The communication port 812 may be adapted to be coupled to one or more peripheral devices 814, such as a modem, a printer, a computer, a scanner, or a camera, or to a network, such as a local area network, remote area network, intranet, or the Internet, for example.

The processor 802 may control the processor-based system 800 by implementing software programs stored in the memory. The software programs may include an operating system, database software, drafting software, word processing software, media editing software, or media playing software, for example. The memory is operably coupled to the processor 802 to store and facilitate execution of various programs. For example, the processor 802 may be coupled to system memory 816, which may include one or more types of volatile memory, such as dynamic random access memory (DRAM). The system memory 816 may further include other types of volatile memory, non-volatile memory, or a combination thereof. In some embodiments, the system memory 816 may include semiconductor devices, such as the semiconductor devices including memory cells and memory arrays including the capacitor structures 200 (FIG. 5A, FIG. 5B).

The processor 802 may also be coupled to non-volatile memory 818. The non-volatile memory 818 may include one or more of STT-MRAM, MRAM, read-only memory (ROM) such as an EPROM, resistive read-only memory (RROM), and Flash memory (e.g., 3D NAND) to be used in conjunction with the system memory 816. The size of the non-volatile memory 818 is typically selected to be just large enough to store any necessary operating system, application programs, and fixed data. Additionally, the non-volatile memory 818 may include a high capacity memory such as disk drive memory, such as a hybrid-drive including resistive memory or other types of non-volatile solid-state memory, for example.

Accordingly, in some embodiments, an electronic system comprises processor, a semiconductor device operably coupled to the processor, and a power supply in operable communication with the processor. The semiconductor device includes a capacitor structure comprising a first set of capacitors comprising a first group of conductive vias extending through a stack of conductive materials and dielectric materials, a second set of capacitors comprising a second group of conductive vias extending through the stack, wherein each conductive via of the first group of conductive vias and the second group of conductive vias comprises a dielectric liner on a sidewall thereof and a conductive material filling the conductive via, a first electrically conductive lead in electrical communication with the first set of capacitors, and a second electrically conductive lead in electrical communication with the second set of capacitors.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A device, comprising:
   a stack structure comprising alternating levels of a dielectric material and a conductive material; and
   vias located within a via region of the stack structure and extending through at least a portion of the stack structure, the vias comprising a dielectric material and a conductive material on the dielectric material, the dielectric material of the vias electrically insulating the conductive material of the vias from all of the conductive materials of the stack structure.

2. The device of claim 1, wherein the conductive material of the vias comprises a material selected from the group consisting of aluminum, copper, nickel, chromium, cobalt, ruthenium, rhodium, palladium, silver, platinum, gold, iridium, tantalum, and tungsten.

3. The device of claim 1, wherein the vias are isolated from a memory array region of the device by one or more trenches comprising an insulative material.

4. The device of claim 1, wherein the vias contact a source material.

5. The device of claim 1, wherein the vias are arranged in rows and columns.

6. The device of claim 1, wherein at least one via of the vias is in electrical communication with at least another of the vias.

7. The device of claim 1, wherein the conductive material of the vias comprises the same material composition as the conductive material of the alternating levels of the stack structure.

8. The device of claim 1, wherein the dielectric material of the vias has a thickness between about 10 nm and about 50 nm.

9. An electronic device, comprising:
   an input device;
   an output device;
   a processor device operably coupled to the input device and the output device; and
   a semiconductor device operably coupled to the processor device, the semiconductor device comprising:
      a stack structure comprising alternating conductive materials and dielectric materials arranged in tiers, the tiers individually comprising one of the conductive materials and one of the dielectric materials; and
      vias extending through the stack structure, the vias each comprising:
         a dielectric liner extending vertically through the stack structure and contacting the conductive materials and the dielectric materials of the stack structure; and
         a conductive material extending through the stack structure adjacent to the dielectric liner, the conductive material of the vias spaced from the dielectric materials by the dielectric liner.

10. The electronic device of claim 9, wherein the stack structure comprises at least about 16 tiers.

11. The electronic device of claim 9, wherein the vias comprise a portion of a decoupling capacitor.

12. The electronic device of claim 9, wherein the conductive material of the vias extends at least about 4 μm into the stack structure.

13. The electronic device of claim 9, wherein the vias comprise a first group of vias isolated from a second group of vias by another dielectric material.

14. The electronic device of claim 9, wherein the vias overlie a source material.

15. The electronic device of claim 9, wherein the vias are isolated from memory cell pillars of a NAND structure.

16. A device, comprising:
   a stack structure comprising alternating levels of a conductive material and an insulative material;
   a first group of capacitor structures comprising vias extending into the stack structure, the first group of capacitor structures comprising:
      first vias extending through the stack structure, the first vias comprising a first dielectric material and a first conductive material, the first conductive material of the first vias isolated from the levels of the conductive material of the stack structure by the first dielectric material; and
   a second group of capacitor structures comprising vias extending into the stack structure and arranged in series with the first group of capacitor structures, the second group of capacitor structures comprising:
      second vias extending through the stack structure, the second vias comprising a second dielectric material and a second conductive material, the second conductive material isolated from the levels of the conductive material of the stack structure by the second dielectric material.

17. The device of claim 16, wherein the first vias are physically isolated from the second vias.

18. The device of claim 16, wherein the first conductive material of the first vias comprises tungsten.

19. The device of claim 16, wherein the first vias and the second vias are separated from memory cell pillars comprising NAND structures by a trench comprising another insulative material.

20. The device of claim 16, wherein the first conductive material of the first vias and the second conductive material of the second vias contact a source material underlying the stack structure.

* * * * *

UNITED STATES PATENT AND TRADEMARK OFFICE
CERTIFICATE OF CORRECTION

PATENT NO. : 10,910,306 B2  Page 1 of 1
APPLICATION NO. : 16/870417
DATED : February 2, 2021
INVENTOR(S) : Eric H. Freeman It is certified that error appears in the above-identified patent and that said Letters Patent is hereby corrected as shown below:

On the Title Page
In ITEM (63)    change "Jul. 29, 2019, which" to --Jul. 29, 2019, now Pat. No. 10,756,014, which--

In the Specification
Column 5, Line 50,    change "(Sii-xGex, where" to --(Si$_1$-xGex, where--

Signed and Sealed this
Twenty-third Day of March, 2021

Drew Hirshfeld
*Performing the Functions and Duties of the
Under Secretary of Commerce for Intellectual Property and
Director of the United States Patent and Trademark Office*